United States Patent
Batude et al.

(10) Patent No.: US 11,139,209 B2
(45) Date of Patent: Oct. 5, 2021

(54) 3D CIRCUIT PROVIDED WITH MESA ISOLATION FOR THE GROUND PLANE ZONE

(71) Applicant: COMMISSARIAT A L'ENERGIE ATOMIQUE ET AUX ENERGIES ALTERNATIVES, Paris (FR)

(72) Inventors: Perrine Batude, Grenoble (FR); Francois Andrieu, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/716,659

(22) Filed: Dec. 17, 2019

(65) Prior Publication Data

US 2020/0203229 A1 Jun. 25, 2020

(30) Foreign Application Priority Data

Dec. 19, 2018 (FR) ...................... 18 73965

(51) Int. Cl.
*H01L 21/822* (2006.01)
*H01L 21/84* (2006.01)
(Continued)

(52) U.S. Cl.
CPC .... *H01L 21/8221* (2013.01); *H01L 21/02126* (2013.01); *H01L 21/02164* (2013.01);
(Continued)

(58) Field of Classification Search
None
See application file for complete search history.

(56) References Cited

U.S. PATENT DOCUMENTS 9,023,688 B1   5/2015   Or-Bach et al.
9,761,583 B2   9/2017   Fenouillet-Beranger et al.
(Continued)

FOREIGN PATENT DOCUMENTS

FR   3 059 148 A1   5/2018

OTHER PUBLICATIONS

French Preliminary Search Report dated Oct. 10, 2019 in French Application 18 73965 filed on Dec. 19, 2018 (with English Translation of Categories of Cited Documents), 3 pages.

*Primary Examiner* — Asok K Sarkar
(74) *Attorney, Agent, or Firm* — Oblon, McClelland, Maier & Neustadt, L.L.P.

(57) ABSTRACT

A production of a device with superimposed levels of components including in this order providing on a given level $N_1$ provided with one or more components produced at least partially in a first semiconductor layer: a stack including a second semiconductor layer capable of receiving at least one transistor channel of level $N_2$, above said given level $N_1$, the stack including a ground plane layer situated between the first and second semiconductor layers as well as an insulator layer separating the ground plane layer from the second semiconductor layer, one or more islands being defined in the second semiconductor layer. A gate is formed on at least one island. Distinct portions are etched in the second semiconductor ground plane layer. An isolation zone is formed around the island by the gate and the island.

8 Claims, 5 Drawing Sheets

(51) Int. Cl.
    *H01L 21/02*      (2006.01)
    *H01L 21/265*     (2006.01)
    *H01L 21/306*     (2006.01)
    *H01L 21/311*     (2006.01)
    *H01L 21/3205*    (2006.01)
    *H01L 21/324*     (2006.01)
    *H01L 21/762*     (2006.01)
    *H01L 21/768*     (2006.01)

(52) U.S. Cl.
    CPC .. *H01L 21/02667* (2013.01); *H01L 21/26513* (2013.01); *H01L 21/30604* (2013.01); *H01L 21/31111* (2013.01); *H01L 21/324* (2013.01); *H01L 21/32053* (2013.01); *H01L 21/76254* (2013.01); *H01L 21/76895* (2013.01); *H01L 21/84* (2013.01); *H01L 21/022* (2013.01); *H01L 21/0217* (2013.01); *H01L 21/02181* (2013.01)

(56) References Cited

U.S. PATENT DOCUMENTS

| | | |
|---|---|---|
| 10,115,637 B2 | 10/2018 | Fenouillet-Beranger et al. |
| 2011/0298021 A1 | 12/2011 | Tada et al. |
| 2013/0193550 A1 | 8/2013 | Sklenard et al. |
| 2018/0277530 A1* | 9/2018 | Or-Bach ................. H01L 25/50 |

\* cited by examiner

3D CIRCUIT PROVIDED WITH MESA ISOLATION FOR THE GROUND PLANE ZONE

TECHNICAL FIELD AND PRIOR ART

The present application relates to the field of integrated circuits provided with electronic components distributed on several levels, in particular superimposed transistors. Such devices are generally qualified as "3D" circuits.

To increase the density of transistors in integrated circuits, one solution consists in distributing the transistors on several superimposed levels of semiconductor layers. Such three-dimensional or "3D" integrated circuits thereby typically comprise at least two semiconductor layers arranged one above the other and separated from each other by at least one insulator layer.

In this type of device, it is known to integrate a so-called "ground plane" or "rear gate" layer made of doped conductor or semiconductor material arranged between the two superimposed semiconductor layers. Such a layer situated under an upper level semiconductor layer is generally separated from this semiconductor layer through an insulator layer. This insulator layer is provided, in terms of material and thickness, so as to be able to implement an electrostatic coupling between the ground plane layer and the upper level semiconductor layer. Thus, the ground plane layer may make it possible in particular to control the threshold voltage of a transistor of which the channel region extends into the upper level semiconductor layer and which is situated above this ground plane layer.

Just as the upper semiconductor layer may be etched in one or more active zones, the ground plane layer may itself be etched in one or more distinct regions during the method for producing such a circuit.

To realise an isolation around an active zone as well as an isolation around a portion of the ground plane layer, a method of type commonly called STI (shallow trench isolation) may then be carried out.

During an STI isolation method a trench is typically formed in a semiconductor layer and one or more dielectric materials such as silicon dioxide are deposited to fill the trench. Excess dielectric is next eliminated by means of at least one chemical mechanical planarization (CMP) step. Such a method is generally expensive to implement, in particular due to the planarization step(s).

In certain cases, the production of isolation zones of STI type may also require one or more oxide densification steps at high temperature. Yet, within the framework of the production of certain 3D circuits where the upper transistor is formed directly above the lower device, it is generally justly sought to limit the thermal budget for implementing the upper level(s) of components.

The document U.S. Pat. No. 9,761,593 B2 emanating from the applicant discloses a method for producing a 3D circuit with a ground plane layer in which firstly the isolation is produced around the active zone of an upper level transistor. The isolation of the ground plane zone associated with this active zone is only carried out later. The realisation of the isolation requires an important number of steps.

The problem is thus posed of finding a new method for producing a 3D circuit and in particular including the realisation of an isolation of the ground plane layer and which is improved over the aforementioned drawbacks.

DESCRIPTION OF THE INVENTION

An embodiment of the present invention provides a method for producing a device with superimposed levels of components including in this order:

a) providing on a given level provided with one or more components produced at least partially in a first semiconductor layer: a stack including a second semiconductor layer capable of receiving at least one transistor channel of level above said given level, said stack including a so-called ground plane layer made of conductor or semiconductor material doped or capable of being doped situated between the first semiconductor layer and the second semiconductor layer as well as an insulator layer separating the ground plane layer from the second semiconductor layer, one or more islands being defined in the second semiconductor layer, b) forming a gate of a transistor on at least one island among said one or more islands, c) defining by etching one or more distinct portions in the ground plane layer so as to free a space around at least one first etched portion of the ground plane layer arranged under and facing said island, d) forming an isolation zone around said island and said first portion by deposition of at least one layer made of insulator material covering the gate and said island, the insulator layer filling said space around said first portion of the ground plane layer, e) formation of conductive pads traversing said layer made of insulator material, one or more of said conductive pads being connected with said island, at least one other conductive pad being connected with said first portion of the ground plane layer.

The implementation of such an isolation zone is less expensive than a method of STI type, requiring an important number of steps.

According to a particularly advantageous embodiment for which the ground plane layer is made of semiconductor material, after definition of said one or more distinct portions of the ground plane layer and prior to the deposition of the layer made of insulator material: one or more zones of compound of metal and semiconductor are formed, by deposition of at least one metal layer respectively on said island and on at least one region of said first portion, then at least one thermal annealing. Thus, a silicidation is carried out before realising the isolation, which can notably make it possible to silicidise on a greater surface area and to produce contacts of improved quality and in particular of reduced resistance.

According to a possible embodiment, after definition of said one or more distinct portions of the ground plane layer and prior to the formation of said one or more zones of compound of metal and semiconductor, an opening is formed in said insulator layer revealing a region of said first portion, at least one zone of compound of metal and semiconductor being produced at the level of said region of said first portion.

In an alternative, when the method includes etchings at steps a), b) and c), the insulator layer may be provided with a thickness such that following said etchings at the end of step c), and prior to the formation of zones of compound of metal and semiconductor, said first portion is uncovered in a zone which extends around said island and is not situated facing said island. Such an alternative may make it possible to avoid a photolithography step.

Advantageously, among the conductive pads produced, it is possible to provide at least one given conductive pad formed so as to traverse said space filled by said insulator material, said given conductive pad being connected to the first level $N_1$ of components.

According to a particular embodiment, the insulator layer separating the ground plane layer from the second semiconductor layer may be formed of a stack of layers of different dielectric materials. This may make it possible to produce an insulator layer more resistant to etching.

According to another particular embodiment in which the insulator layer is made of silicon oxide, prior to step b) of formation of the gate it is possible to carry out an implantation of carbon on the surface of the insulator layer in order to form SiOC or an implantation of carbon and nitrogen in order to form SiOCN. By modifying in this manner the composition of the insulator layer, said insulator layer is made more resistant to etching in order notably to be able to preserve a thickness of this layer when a doping is carried out to produce junctions in the semiconductor island and thereby make it possible to protect the ground plane layer during this doping.

According to a particular embodiment in which, prior to step a), an assembly by bonding of said stack on said given level $N_1$ is carried out, the method may include prior to said assembly a step of doping of the ground plane layer, the ground plane layer being preferably doped according to a concentration of dopants equal to or greater than $1^e20$ at/cm$^3$.

BRIEF DESCRIPTION OF THE DRAWINGS

The present invention will be better understood on reading the description of exemplary embodiments, given for purely indicative purposes and in no way limiting, while referring to the appended drawings in which.

Identical, similar or equivalent parts of the different figures bear the same numerical references so as to make it easy to go from one figure to the next.

The different parts represented in the figures are not necessarily according to a uniform scale, in order to make the figures more legible.

Moreover, in the description hereafter, terms that depend on the orientation of the structure such as "on", "above", "under", "underneath", "lateral", "upper", "lower" apply by considering that the structure is oriented in the manner illustrated in the figures.

DETAILED DESCRIPTION OF PARTICULAR EMBODIMENTS

Figure 1A:
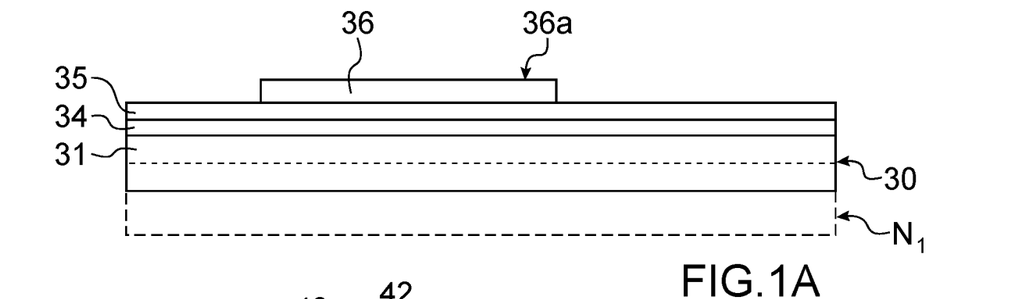
FIGS. 1A-1G serve to illustrate an example of method such as implemented according to an embodiment of the present invention and for the implementation of an isolation of a ground plane layer in a 3D integrated circuit with superimposed levels of electronic components.

Reference is now made to FIG. 1A giving an example of possible starting structure for the implementation of a method according to an embodiment of the present invention.

This structure comprises a first level $N_1$ of electronic components represented schematically by a contour in broken lines.

This level $N_1$ is typically produced from a substrate including a first superficial semiconductor layer, for example made of silicon, in which one or more electronic components such as photo-sites and/or photodiodes and/or transistors are at least partially formed.

Figure 2:
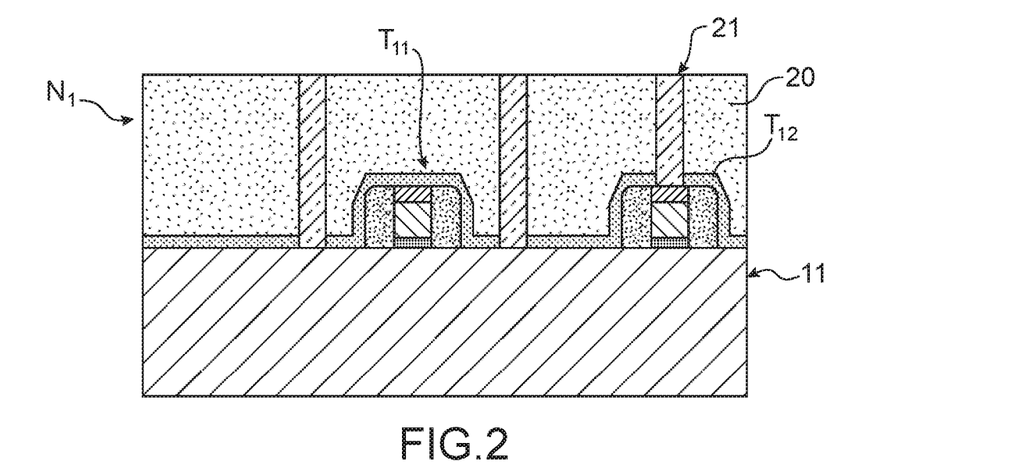
FIG. 2 serves to illustrate a particular embodiment of a first level of components of the 3D integrated circuit.

In the example illustrated in FIG. 2, the components of the first level $N_1$ are transistors $T_{11}$ and $T_{12}$, in particular of MOS (Metal Oxide Semi-conductor) type and have respective channel regions which extend into the first semiconductor layer 11. One or more conductive connection zones 21 belonging to the first level $N_1$ may also be formed at this stage above the transistors $T_{11}$, $T_{12}$ and are connected to the latter. The conductive connection zones 21 are typically made of metal, for example tungsten, and are arranged in at least one insulator layer 20 arranged on the transistors.

After having formed the first level $N_1$ of components, a stack of layers is produced, typically by transfer onto this first level $N_1$.

The stack is provided in particular with a so-called "ground plane" layer 34 intended to produce a polarisation underneath at least one transistor of a second level $N_2$ and to be able in particular to modulate the threshold voltage of this transistor. The ground plane layer 34 firstly typically extends full wafer, in other words in a continuous manner between the first level $N_1$ and the second level $N_2$. The ground plane layer 34 may be a conductor material such as a metal or an alloy of metal and semiconductor or be advantageously a semiconductor material doped or intended to be doped. For example, the layer 34 based on polysilicon doped or intended to be doped is provided. A ground plane layer 34, doped during its formation (in situ doping) for example by deposition of semiconductor in amorphous or polycrystalline form, may be produced. An annealing may make it possible to activate the dopants or to increase the activation level and to make the semiconductor material polycrystalline in the case where it has been deposited in amorphous form. In an alternative or in combination, it is possible to carry out a doping by implantation of this layer 34 which makes it possible to attain a high level of doping. Typically, a ground plane layer 34 of low thickness, for example less than 100 nm, is implemented.

The ground plane layer 34, when it is based on doped semiconductor material, is preferably provided with a high concentration of dopants advantageously greater than that provided for the zones of the second semiconductor layer 36 intended to form source and drain regions or for accessing the channel of a transistor of the second level $N_2$. It is thereby sought to avoid the formation of parasitic junctions under the active zone. Advantageously, the concentration of dopants is chosen of the order of $1^e20$ at/cm$^3$ or higher in the ground plane layer 34.

An insulator layer 35 is arranged on the ground plane layer 34 and separates the ground plane layer 34 from a second semiconductor layer 36. The insulator layer 35 arranged between the ground plane layer 34 and this second semiconductor layer 36 is configured, in particular in terms of material composing it and thickness, so as to enable electrostatic coupling between the ground plane layer 34 and the second semiconductor layer 36. The insulator layer 35 is for example made of $SiO_2$ and has a thickness that may be comprised for example between 5 nm and 100 nm. The insulator layer 35 may advantageously be a buried oxide (BOX) layer of a semiconductor on insulator substrate of which the second semiconductor layer 36 is the superficial layer situated on the BOX.

The stack produced may include or be formed on an insulator layer 31 on which the ground plane layer 34 is disposed. The insulator layer 31 is typically based on silicon oxide.

According to a particular embodiment illustrated in FIG. 1A, this insulator layer 31 results from the assembly by bonding of two insulator layers, for example made of silicon oxide, one of the two insulator layers covering the first level $N_1$ of components. A bonding interface 30 is here represented schematically by means of a discontinuous line.

Next, one or more islands are defined in the second semiconductor layer 36 capable of forming respectively one or more active zones of transistors of the second level $N_2$. To do so, a dry etching may be carried out, for example using HBr and Cl for example, of the second semiconductor layer 36.

In the view of FIG. 1A, an island 36a derived from the etching of the second semiconductor layer 36 is represented. The etching is in this example carried out with stoppage on the insulator layer 35. The ground plane layer 34 is thus not at this stage etched and is conserved continuous.

Figure 1B:
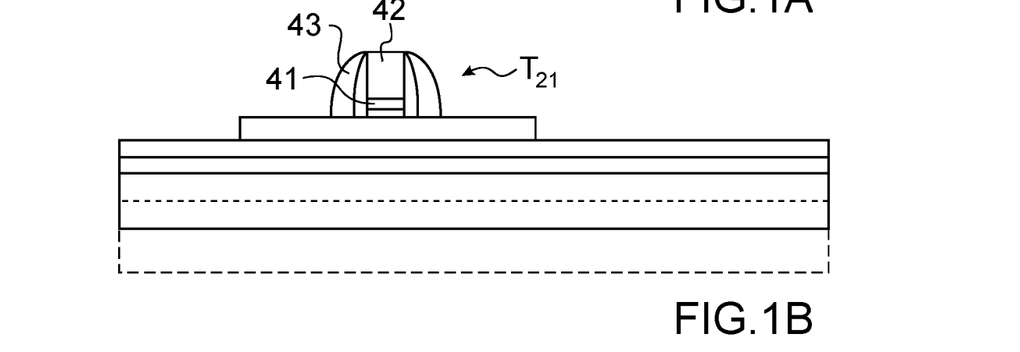

Steps of formation of a transistor $T_{21}$, for example of MOS type, are next carried out. This formation includes notably a production of a gate dielectric 41 and a gate 42 on the island 36a, the formation of spacers 43 on either side of lateral flanks of the gate 42 (FIG. 1B). One or more doping steps to produce regions of access to the channel and/or source regions situated in the island 36a on either side of the gate may also be implemented, typically by implantation.

In the case where the ground plane layer 34 remains coated at this step with the insulator layer 35, this insulator layer 35 makes it possible to protect the zones of the ground plane layer 34 from the step of implantation of dopants in the island 36a. The creation of a parasitic diode is thereby avoided in particular in the case where the semiconductor layer 36 in which the island 36a is formed is doped according to a doping of opposite type, for example an N type doping whereas the ground plane layer is doped according to a P type doping. In this case, a sufficient thickness $h_2$ of insulator layer 35 is conserved and which may be for example at least 10 nm. The thickness $h_2$ may depend on several parameters, of which the level of doping of the ground plane layer, the access implantation conditions and the thermal budget to produce the transistor.

To make it possible to preserve at this stage of the method an insulator layer 35 of sufficient thickness to serve as protection, it is possible to provide to produce this layer with a particular composition. According to a particular embodiment, the insulator layer 35 may be, from its formation, produced in the form of a stack of several different materials, for example a silicon oxide/silicon nitride/silicon oxide, or silicon oxide/hafnium oxide/silicon oxide stack. Such stacks may make it possible to make the insulator layer 35 more resistant to the etchings carried out and/or to the wet treatment necessary for the fabrication of the transistor notably to define the island and/or to etch the gate, to define the spacers.

According to another particular embodiment, it is possible to provide to modify in the course of the method the composition of the insulator layer 35, for example by implantation in order to make it more resistant to etching. For example, when the insulator layer 35 is made of silicon oxide, an implantation of atoms of carbon and/or nitrogen may be implemented in order to form SiOC or SiOCN more resistant than silicon oxide to the steps of wet etching, in particular based on HF. Such a step is then carried out typically after definition of the island 36a and before the definition of the gate.

Then (FIG. 1C), one or more patterns are formed by etching in the continuous ground plane layer 34 in several portions. A space 51 is produced for example in the form of a groove around a first portion 34a of the ground plane layer 34. In the case illustrated in FIG. 1C where the ground plane layer 34 is divided into several portions 34a, 34b this groove 51 forms a separation between the first portion 34a of the ground plane layer situated under and facing the transistor $T_{21}$ and a second portion 34b which may be provided to serve as rear electrode for another transistor (not represented). A localised etching through the opening of a masking (not represented) is typically implemented to carry out the cutting of the ground plane layer 34. This cutting may be carried out by etching using HBr and Cl, in particular when the ground plane layer 34 is made of polysilicon.

Figure 1C:
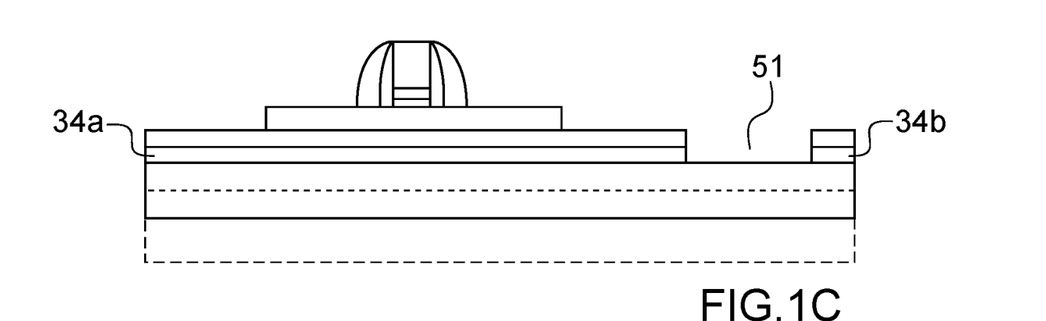

Contact zones may next be produced on the second semiconductor layer 36 and the ground plane layer 34.

Figure 1D:
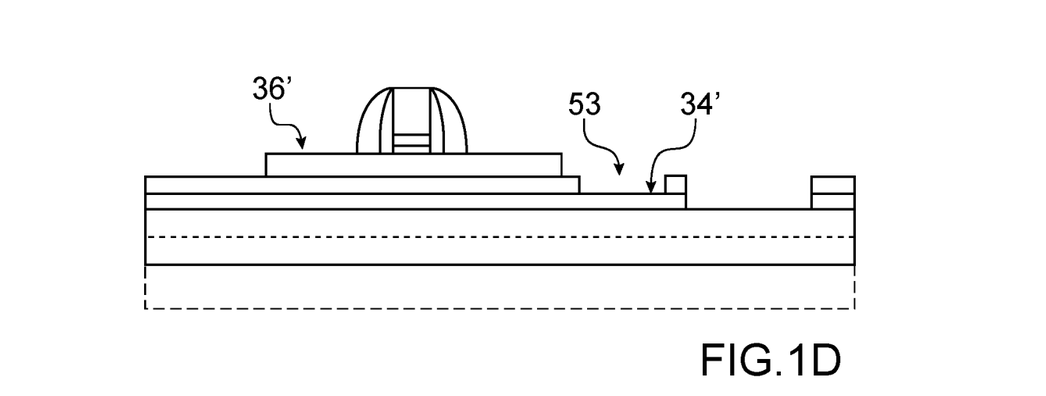

To do so, in the particular exemplary embodiment illustrated in FIG. 1D, at least one opening 53 is produced through the insulator layer 35 revealing a region 34' of the upper face of the portion 34a of the ground plane layer. This opening 53 is carried out typically by photolithography then etching through at least one hole of a protective mask (not represented). A dry etching of the dielectric using CH2F2 and SF6 in the case of a silicon oxide may be for example used to form this opening 53.

After removal of this mask, zones 56a, 56b of compound of metal and semiconductor are formed on the revealed parts 36' of the island 36a, as well as a zone 56c, of compound of metal and semiconductor on the region 34' of the portion 34a of the ground plane layer. To do so, a layer of metal is typically deposited, on the region 34' and the parts 36', and at least one thermal annealing is carried out. In the case where the island 36a is made of silicon, silicided zones are formed, by depositing for example nickel and/or NiPt with for example a proportion of 5% to 15% of Pt and by carrying out at least one thermal annealing.

For example, when a layer of nickel is deposited, an annealing at a temperature comprised for example between 250° C. and 350° C. according to a duration that may be for example of the order of 30 s may be implemented. Then, a selective removal of the non-reacted nickel is carried out and a second annealing is carried out to form the NiSi phase. In this case, the second annealing is typically carried out at a temperature greater than 350° C. for a duration for example of the order of 30 seconds.

Figure 1E:
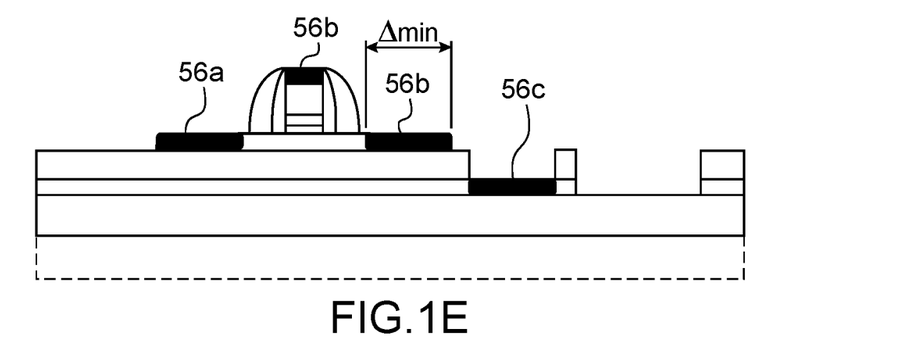

In the exemplary embodiment illustrated in FIG. 1E where at least the upper part of the gate 42 of the transistor $T_{21}$ is made of semiconductor material, for example polysilicon, a zone 56d, of compound of metal and semiconductor is produced concomitantly on this gate 42.

A carrying out of silicidation at this stage of the method, and in particular before implementing an isolation, advantageously makes it possible to produce silicided zones 56a, 56b, 56c of important minimum dimension Δmin (dimension measured parallel to the main plane of the substrate, i.e. passing through the substrate and parallel to the plane [O;x;y] of the point of reference [O;x;y;z]). This dimension Δmin will be able to depend on the technological node but for a given technological node it is typically greater than that provided for a conventional method and in which the silicidation is implemented at the bottom of holes produced through an insulator layer. Indeed, it is possible to provide this dimension Δmin greater than that normally provided to form holes intended to received contact pads.

The carrying out of a silicidation before the isolation of the ground plane layer and the island consequently makes it possible to implement contacts of lower resistance. It is thereby possible to implement an improved electrical contact with the semiconductor island 36a and/or with the ground plane layer 34.

In the case where the ground plane layer is overall doped according to a doping of given type, for example of P type, and also comprises dopants producing a doping of opposite type (here of N type) and resulting from a doping of regions of the semiconductor island 36a, the dimensions of the silicided zone 56d of the ground plane layer are advantageously provided so as to occupy and go beyond a junction zone produced between the two opposite types of doping.

An isolation is next formed around the active zone(s) as well as the ground plane portion(s). This isolation thus has here the particularity of being realised after formation of the gate(s) of transistors respectively on the semiconductor island(s) of the second level $N_2$.

To do so, a first insulator layer 62 is next produced, for example a layer of CESL (Contact Etch Stop Layer) type made of silicon nitride and of thickness $e_1$ for example comprised between 10 nm and 50 nm. The insulator layer 62 may be provided with a sufficient thickness $e_1$ to make it possible to fill the space 51, for example in the form of a groove made around the ground plane portion 34a.

The first insulator layer 62 may be next covered with an insulator layer 64, for example a layer of PMD (pre-metal dielectric) type made of silicon oxide and of thickness $e_2$ typically greater than $e_1$ for example comprised between 100 nm and 700 nm.

Figure 1F:
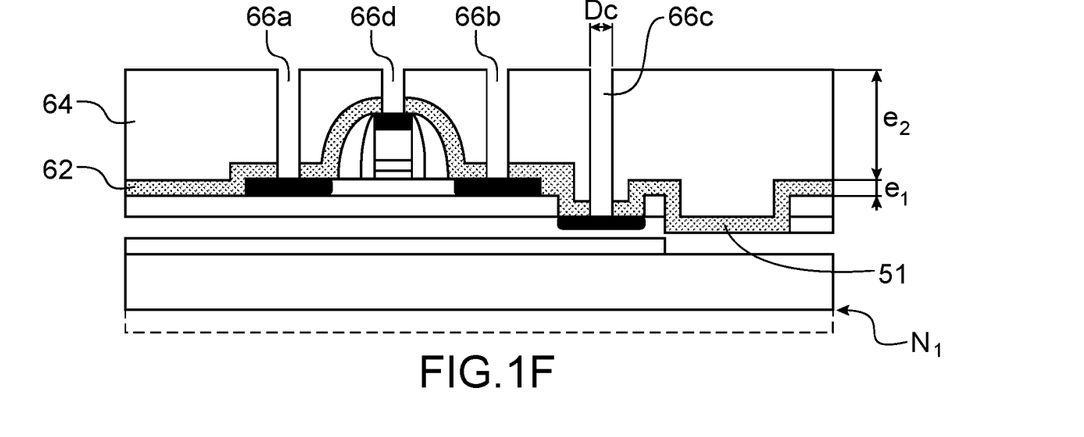

Holes 66a, 66b, 66c, 66d are next formed (FIG. 1F) through the insulator layer(s) 62, 64 and revealing respectively the zones 56a, 56b, 56c, 56d, of compound of metal and semiconductor. The holes 66a, 66b, 66c, 66d have a critical dimension Dc, for example comprised between 20 nm and 500 nm, typically less than the minimum dimension Δmin of the zones 56a, 56b, 56c, 56d, of compound of metal and semiconductor.

Figure 1G:
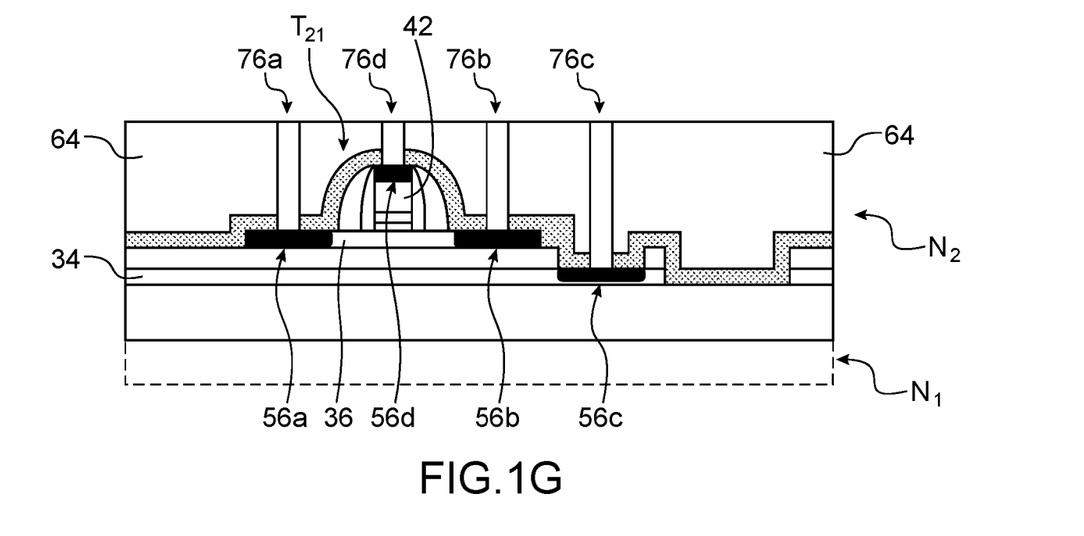

The holes 66a, 66b, 66c, 66d are next filled with conductor material 64, in particular a metal for example such as tungsten (FIG. 1G).

The production of the holes 66a, 66b, 66c, 66d typically by lithography and etching may be carried out concomitantly or in an alternative sequentially. The same is true for the filling which may be carried out concomitantly or sequentially.

Conductive pads 76a, 76b are thereby produced, in contact respectively with silicided zones 56a, 56b produced on the active zone of the transistor $T_{21}$, in other words on the island 36a formed from the second semiconductor layer 36. A conductive pad 76c is also produced in this way, in contact with the ground plane portion 34a situated under the transistor $T_{21}$. A contact pad 66d with the gate may also be formed during this step.

A contact pad (not represented in FIG. 1G) to establish a connection with the first level $N_1$ may also be formed concomitantly. In this case, it is produced by filling a hole traversing the insulator layer 31 arranged between the two levels $N_1$ and $N_2$. This hole is advantageously made in such a way as to traverse the groove 51 produced around the ground plane portion 34a.

Different ways of producing the stack in which the second level $N_2$ of components is formed may be provided.

Figure 3:
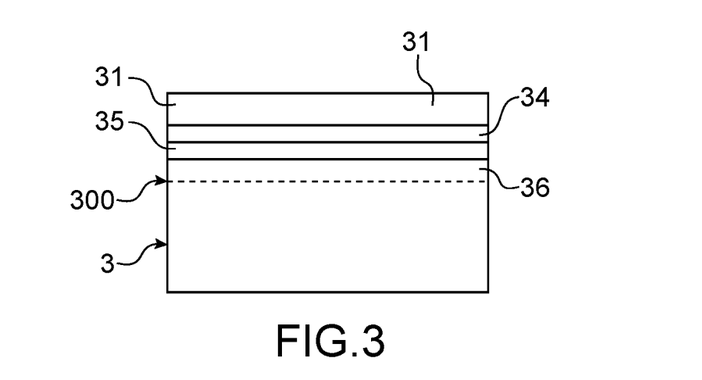
FIG. 3 serves to illustrate a possible starting material for the production of an upper level of transistors arranged above the first level.

In the exemplary embodiment illustrated in FIG. 3, the second semiconductor layer 36 in which it is provided to form the zone(s) for transistor(s) of the second level is a superficial layer of a bulk substrate 3 and on which the insulator layer 35 is next produced, then the ground plane layer and an insulator layer 31 intended to be bonded with the first level $N_1$ of components are deposited. The bonding is typically carried out between two insulator layers and in particular of silicon oxide. In this case, the first level $N_1$ is coated with such an oxide layer prior to bonding. After bonding, the semiconductor layer 36 may be detached from the remainder of the bulk substrate by a Smartcut™ type method while creating an embrittlement zone 300 by implantation of hydrogen ions in the substrate. Steps of polishing and chemical etching for example using TMAH (tetra methyl ammonium hydroxide) or TEAH (tetra ethyl ammonium hydroxide) may also be carried out in order to remove a non-desired thickness of the bulk substrate.

Figure 4:
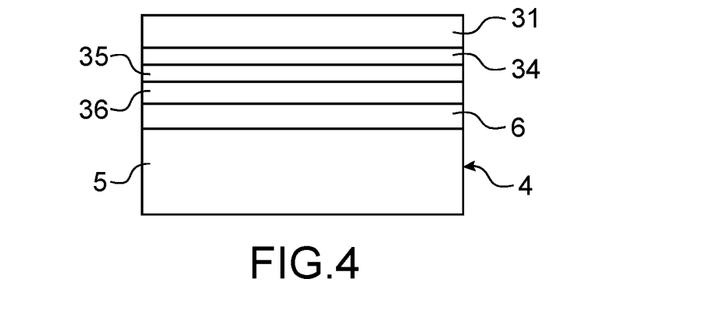
FIG. 4 serves to illustrate an alternative possible starting material for the production of the upper level of transistors.

In the exemplary embodiment illustrated in FIG. 4, the second semiconductor layer 36 intended to receive the channel region of the transistor $T_{21}$ is this time a superficial layer of a substrate 4 of semiconductor on insulator type, for example a substrate of SOI (silicon on insulator) type with a semiconductor support layer 5, an insulator layer 6 typically made of silicon oxide between the support layer 4 and the superficial semiconductor layer 36. On this substrate 4, the insulator layer 35 is next produced, then the ground plane layer 34 and the insulator layer 31 intended to be bonded with the first level $N_1$ of components.

After bonding, the support layer 5 and the insulator layer 6 of the substrate 4 are next eliminated. The support layer 5 may be removed for example by means of polishing and etching steps such as mentioned previously for the bulk substrate. The insulator layer 6 may for its part be removed by etching using HF.

Advantageously, when the ground plane layer 34 is provided made of doped semiconductor material, this doping is carried out by implantation before the assembly by bonding with the first level $N_1$. Thus, such a doping may be carried out for example on one or the other of the stacks illustrated in FIGS. 3 and 4. In this way, it is possible to carry out an implantation of the ground plane layer 34 with a high concentration of dopants and also without having necessarily to traverse the semiconductor layer 36. This also makes it possible to be able to carry out an activation annealing of dopants at high temperature without thermal budget constraint linked to the lower level $N_1$ of components. Carrying out a doping of the ground plane layer 34 before bonding can also make it possible to confer on the ground plane layer 34 a high doping level by implantation without however damaging the semiconductor layer 36 intended to receive one or more transistor channel regions.

An alternative (FIG. 5A) of the example of production method that has been described previously provides that at the end of the step of cutting the ground plane layer 34, the parts 341 of the ground plane layer 34 that are not covered by an island 36a or an active zone of the second semiconductor layer 36 are uncovered. The insulator layer 35 is thereby removed at the places that are not covered by the second semiconductor layer 36. A consumption of this insulator layer 35 may be achieved notably during the etching of the active zone(s), in particular during the definition of the island 36a, in particular when this etching is carried out using HBr and Cl for example.

Figure 5A:
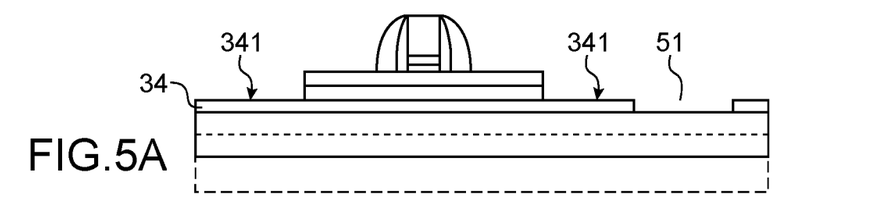
FIGS. 5A-5E serve to illustrate an alternative embodiment for which a silicidation of a zone of the ground plane layer is carried out without carrying out a prior photolithography to uncover this zone.

This insulator layer 35 is typically removed in several steps and in addition a partial removal carried out during the etching making it possible to define the island 36a, the uncovered parts of this layer 35 are consumed during one or more steps of production of the transistor $T_{21}$, for example during the etching of the gate and optionally during one or more cleaning steps, in particular a cleaning step carried out using HF after definition of the gate and before implantation of the source and drain regions. A consumption of the insulator layer 35 may also take place during an optional step of de-oxidation.

Thus, when the groove 51 is formed, the ground plane layer 34 is covered by the insulator layer 35 only at the places situated facing the island 36a produced by etching of the second semiconductor layer 36.

Figure 5B:
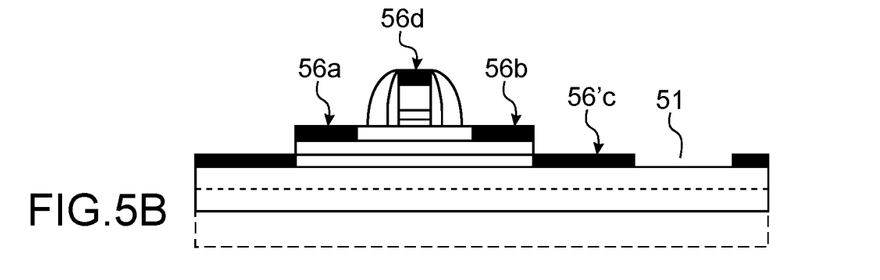

Next are formed zones 56a, 56b, of compound of metal and semiconductor on the island 36a, as well as a zone 56'c of compound of metal and semiconductor on the uncovered parts 341 of the portion 34a or the portions of the ground plane layer. Typically, these zones 56a, 56b, 56c are produced by a method including a deposition of metal and one or more thermal annealing(s). A silicidation of ground plane portion(s) is thereby advantageously carried out, without having to open the insulator layer 35 and in particular without having to carry out an additional step of photolithography. In the exemplary embodiment illustrated in FIG. 5B, a silicided zone 56d is also formed on the gate 42.

Figure 5C:
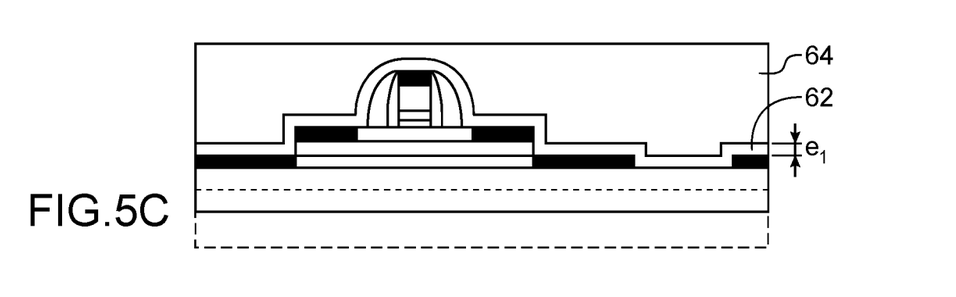

The isolation is next realised around the island 36a and the ground plane portion 34a by depositing the first insulator layer 62 that fills the groove 51 then the second insulator layer 64 (FIG. 5C).

Figure 5D:
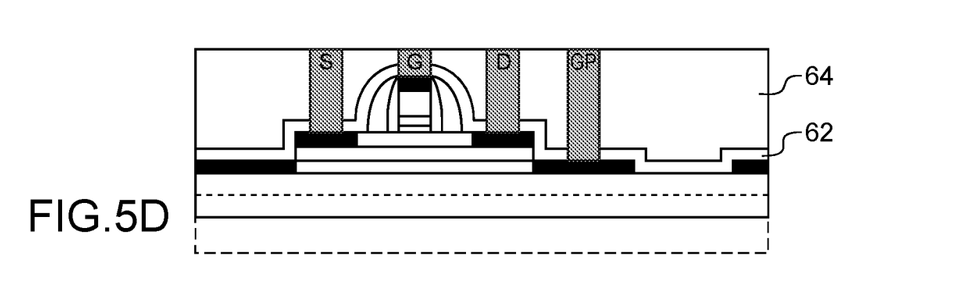

The holes for the contact conductive pads 76a, 76b, 76c, 76d are then formed (FIG. 5D) through the insulator layers 62, 63 and these holes are filled with conductor material typically a metal such as for example tungsten.

Figure 5E:
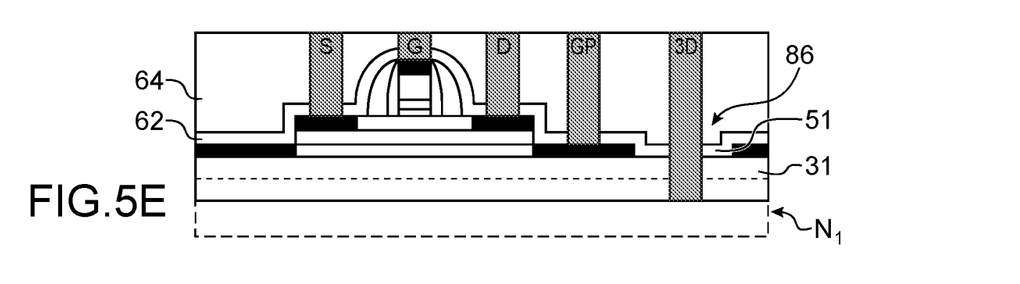

In the particular exemplary embodiment illustrated in FIG. 5E, a conductive pad 86 making contact on the first level $N_1$ is also formed. Such a pad 86 is typically produced by formation of a hole traversing the insulator layers 62, 64, this hole passing through the groove 51 and traversing the insulator layer 31 and optionally other underlying layers to reach a connection zone of the first level $N_1$.

Figure 6:
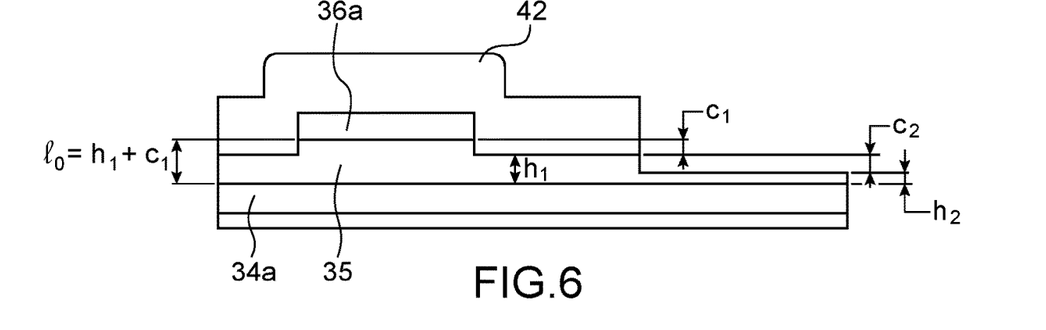
FIG. 6 serves to illustrate a particular example of layout of the insulator layer separating the ground plane layer from a semiconductor island intended to receive a transistor channel region, before a step of doping of the island.

A particular exemplary embodiment is illustrated in FIG. 6 in a case where the transistor gate 42 formed on the island 36a overflows onto the insulator layer 35 and where a thickness c1 of the insulator layer 35 has been consumed, notably during etching making it possible to define the island 36a and optionally steps prior to the deposition of the gate 42 and where a thickness $c_2$ of the insulator layer 35 has next been consumed notably during etching making it possible to define the gate 42 and optionally steps of the method carried out after the etching of the gate 42 but prior to a step of doping by implantation of the island 36a in order to produce junctions.

In this case, advantageously, the total thickness $e_0 = h_1 + c_1$ of the insulator layer 35, as well as the steps of etching leading to consumptions of thicknesses $c_1$, $c_2$, are provided so as to conserve, before implantation to produce the junctions, a thickness $h_2$ of a zone of the insulator layer 35 situated facing the ground plane layer 34 and which is located neither facing the gate 42 nor facing the island 36a, sufficient to prevent or at least to limit doping of the ground plane layer 34. The creation of parasitic diodes is thereby avoided. When the insulator layer 35 is made of silicon oxide, it is provided to conserve a thickness $h_2$ for example greater than 15 nm in the case of an implantation carried out with boron with an energy between 8 key and 12 key and a dose between 1e15 at/cm$^3$ and 6e15 at/cm$^3$ and an activation annealing at around 1050° C. and 14 nm of silicidation with an N type doped ground plane with 2e20 at/cm$^3$.

Apart from the fact of providing to conserve this thickness $h_2$, a production of junctions by implantation at limited energy and/or dose may be implemented. "Limited dose" and "limited energy" are taken to mean for example, for a PMOS transistor: a dose of boron less than 2e15 at/cm$^3$ and an energy less than 8 keV for a ground plane layer N doped at 2e20 at/cm$^3$.

Figure 7:
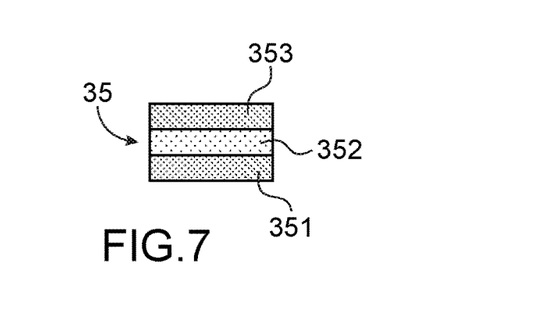
FIG. 7 serves to illustrate a particular exemplary embodiment of an insulator layer separating the ground plane layer from an island into which a transistor channel region extends.

To make it possible to facilitate the conservation of a sufficient thickness $h_2$ to form a protective screen for the ground plane layer 34 during the step(s) of doping of the island 36a, it is possible as indicated previously and as illustrated in FIG. 7, to provide the insulator layer 35 in the form of a stack of several different dielectric materials 351, 352, 353. For example a stack including a layer of silicon nitride arranged between two layers of silicon oxide, or instead a layer of HfO$_2$ arranged between two layers of silicon oxide is produced. The fact of providing an insulator layer 35 in the form of such a stack makes it more resistant to etchings, and in particular to wet etchings using HF.

It is also possible to make the insulator layer 35 more resistant to the different etching steps by modifying its composition. To do so, it is possible to provide to modify this composition at least on the surface by implantation then annealing. For example, when the insulator layer 35 is made of silicon oxide, an implantation of atoms of carbon and/or nitrogen may be implemented in order to form SiOC or SiOCN more resistant to the chemical etching steps, in particular using HF, than silicon oxide.

Figure 8:
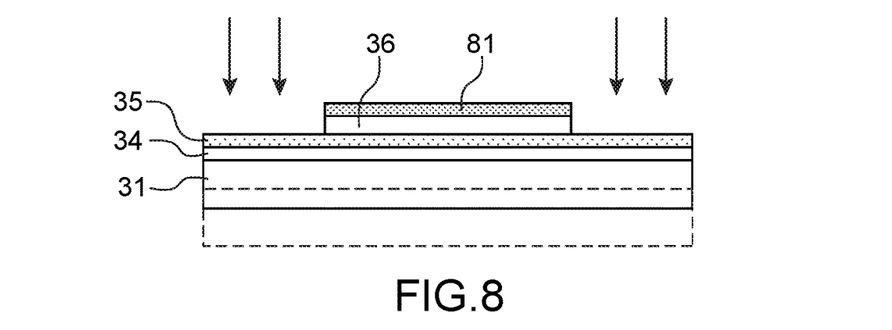
FIG. 8 serves to illustrate a particular example of method of modification by implantation of the composition of the insulator layer separating the ground plane layer from the semiconductor layer in which the transistor channel region of a second level is provided.

It is possible to carry out such an implantation aiming to modify the composition of the insulator layer 35 and to make it more resistant to etching after having carried out an etching of the island 36a. Thus, in the particular exemplary embodiment illustrated in FIG. 8, after having carried out an etching of the island 36a while using a hard mask 81 as protective mask, an implantation of the insulator layer 35 is carried out, in particular using carbon and/or nitrogen.

The invention claimed is:

1. A method for producing a device with superimposed levels of components comprising,
   in sequential order, the following steps:
   a) providing on a given level provided with one or more components produced at least partially in a first semiconductor layer:
   a stack including a second semiconductor layer capable of receiving at least one transistor channel of level above said given level, said stack including a so-called ground plane layer made of conductor or semiconductor material or doped semiconductor material situated between the first semiconductor layer and the second semiconductor layer as well as an insulator layer separating the ground plane layer from the second semiconductor layer, one or more islands being defined in the second semiconductor layer,
   b) after step a), forming a gate of a transistor on at least one island among said one or more islands,
   c) after step b), defining by etching one or more distinct portions in the ground plane layer so as to free a space around at least one first etched portion of the ground plane layer arranged under and facing said island, d) after step c), forming an isolation zone around said island and said first portion by deposition of at least one layer made of insulator material covering the gate and said island, the layer of insulator material filling said space around said first portion of the ground plane layer, e) after step d), forming conductive pads traversing said layer made of insulator material, one or more of said conductive pads being connected with said island, at least one other conductive pad being connected with said first portion of the ground plane layer.

2. The method according to claim 1, wherein the ground plane layer is made of semiconductor material and in which after definition of said one or more distinct portions of the ground plane layer and prior to the deposition of the layer made of insulator material, one or more zones of compound of metal and semiconductor are formed, by:

deposition of at least one metal layer respectively on said island and on at least one region of said first portion, at least one thermal annealing.

3. The method according to claim 2, wherein after definition of said one or more distinct portions of the ground plane layer and prior to the formation of said one or more zones of compound of metal and semiconductor, an opening is formed in said insulator layer revealing a region of said first portion, at least one zone of compound of metal and semiconductor being produced at the level of said region of said first portion.

4. The method according to claim 2, wherein the method includes etchings at steps a), b) and c), and wherein the insulator layer is provided with a thickness such that following said etchings at the end of step c), and prior to the formation of zones of compound of metal and semiconductor, said first portion is uncovered in a zone which extends around said island and is not situated facing said island.

5. The method according to claim 2, wherein among said conductive pads at least one given conductive pad is produced so as to traverse said space filled by said insulator material, said given conductive pad being connected to the first level of components.

6. The method according to claim 1, wherein the insulator layer separating the ground plane layer from the second semiconductor layer is formed of a stack of layers of different dielectric materials.

7. The method according to claim 1, wherein the insulator layer is made of silicon oxide and in which prior to step b) of formation of the gate an implantation of carbon is carried out on the surface of the insulator layer in order to form SiOC or an implantation of carbon and nitrogen in order to form SiOCN.

8. The method according to claim 1, wherein prior to step a) an assembly by bonding of said stack on said given level is carried out, the method including prior to said assembly a step of doping of the ground plane layer, the ground plane layer preferably being doped according to a concentration of dopants equal to or greater than $1^e20$ at/cm$^3$.

* * * * *